(12) United States Patent
Shibayama et al.

(10) Patent No.: US 9,571,066 B2
(45) Date of Patent: Feb. 14, 2017

(54) DIGITAL FILTER CIRCUIT, DIGITAL FILTER PROCESSING METHOD AND DIGITAL FILTER PROCESSING PROGRAM STORAGE MEDIUM

(71) Applicant: NEC CORPORATION, Tokyo (JP)

(72) Inventors: Atsufumi Shibayama, Tokyo (JP); Junichi Abe, Tokyo (JP)

(73) Assignee: NEC CORPORATION, Tokyo (JP)

( * ) Notice: Subject to any disclaimer, the term of this patent is extended or adjusted under 35 U.S.C. 154(b) by 262 days.

(21) Appl. No.: 14/377,092

(22) PCT Filed: Feb. 13, 2013

(86) PCT No.: PCT/JP2013/000754
§ 371 (c)(1),
(2) Date: Aug. 6, 2014

(87) PCT Pub. No.: WO2013/125173
PCT Pub. Date: Aug. 29, 2013

(65) Prior Publication Data
US 2015/0019608 A1    Jan. 15, 2015

(30) Foreign Application Priority Data

Feb. 20, 2012 (JP) ................................. 2012-034002

(51) Int. Cl.
*G06F 17/10* (2006.01)
*H03H 17/02* (2006.01)
*G06F 17/14* (2006.01)

(52) U.S. Cl.
CPC .......... *H03H 17/0248* (2013.01); *G06F 17/14* (2013.01); *H03H 17/0213* (2013.01); *H03H 2218/04* (2013.01)

(58) Field of Classification Search
CPC .. H03H 17/0248; H03H 17/0213; G06F 17/14
(Continued)

(56) References Cited

U.S. PATENT DOCUMENTS 5,751,616 A * 5/1998 Hegland ................. G06F 17/14
708/401
7,640,282 B2 * 12/2009 Kirkby ................. G06F 17/156
375/343

FOREIGN PATENT DOCUMENTS

JP          2-36385 A      2/1990
JP       2003-115819 A    4/2003
(Continued)

OTHER PUBLICATIONS

International Search Report for PCT Application No. PCT/JP2013/00754, mailed on May 21, 2013.

*Primary Examiner* — Tan V. Mai

(57) ABSTRACT

Reduction of a circuit size and power consumption for performing digital filtering processing in a frequency domain is realized. The digital filter circuit includes: a complex conjugate generation unit for generating a second complex number signal including conjugate complex numbers of all complex numbers included in a first complex number signal of the frequency domain generated by converting a complex number signal of a time domain by Fourier transform; a filter coefficient generation unit for generating a first and a second frequency domain filter coefficient of a complex number from a first, a second and a third input filter coefficient of a complex number having been inputted; a first filtering unit for performing filtering processing to the first complex number signal by the first frequency domain filter coefficient, and outputting a third complex number signal; a second filtering unit for performing filtering processing to the second complex number signal by the second frequency domain filter coefficient, and outputting a fourth complex number signal; and a complex conjugate combining unit for combining the third complex number signal and the fourth complex number signal, and generating a fifth complex number signal.

8 Claims, 11 Drawing Sheets

(58) Field of Classification Search
USPC .................................................. 708/300–323
See application file for complete search history.

(56) References Cited

FOREIGN PATENT DOCUMENTS

| | | |
|---|---|---|
| JP | 2005-65231 A | 3/2005 |
| JP | 2008-17511 A | 1/2008 |
| JP | 2010-219582 A | 9/2010 |
| JP | 2011-4264 A | 1/2011 |
| WO | 2007/010727 A1 | 1/2007 |

* cited by examiner

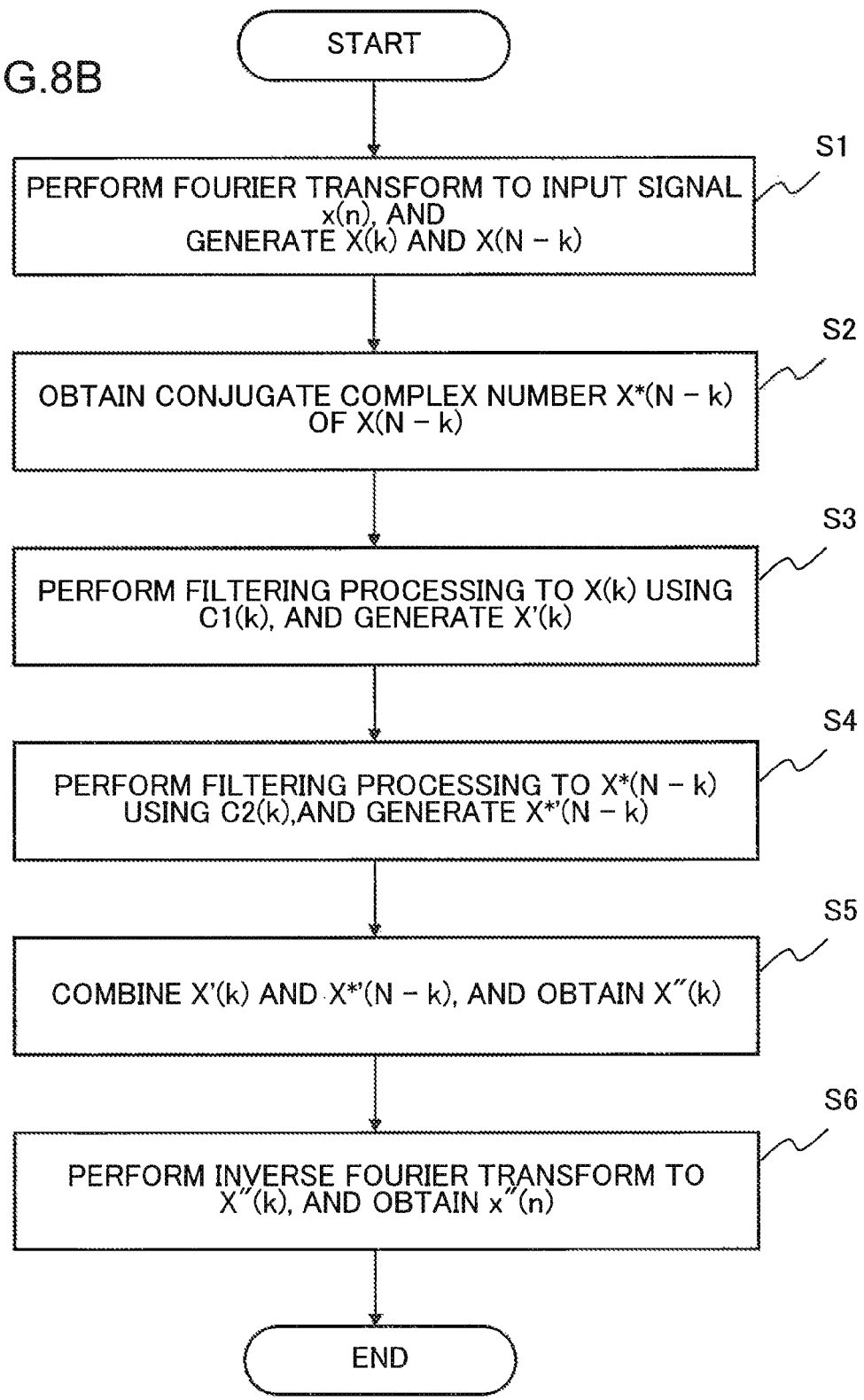

DIGITAL FILTER CIRCUIT, DIGITAL FILTER PROCESSING METHOD AND DIGITAL FILTER PROCESSING PROGRAM STORAGE MEDIUM

This application is a National Stage Entry of PCT/JP2013/000754 filed on Feb. 13, 2013, which claims priority from Japanese Patent Application 2012-034002 filed on Feb. 20, 2012, the contents of all of which are incorporated herein by reference, in their entirety.

TECHNICAL FIELD

The present invention relates to arithmetic processing in digital signal processing, and, more particularly, to a digital filter circuit, a digital filter processing method and a digital filter processing program storage medium.

BACKGROUND ART

There are a FIR (Finite Impulse Response) filter and an IIR (Infinite Impulse Response) filter as a digital filter being used widely. FIG. 9 is an exemplary configuration of a digital filter circuit 100 using a FIR filter.

The digital filter circuit 100 performs filtering processing in a time domain to complex number signal $x(n)=r(n)+js(n)$ (j is an imaginary unit and n is an integer). The digital filter circuit 100 includes three FIR filters 101, 102 and 103.

The FIR filter 101 is a FIR filter of a real number coefficient having the number of taps of 5, the FIR filter performing filtering processing by real number operation to real part signal r(n) of a real number that is the real part of inputted complex number signal x(n). Five filter coefficients a0-a4 of the FIR filter 101 are real numbers. The FIR filter 101 outputs a result of filtering processing as real part signal r'(n).

Similarly, the FIR filter 102 is a FIR filter of real number coefficient having the number of taps of 5, the FIR filter performing filtering processing by real number operation to imaginary part signal s(n) of a real number that is the imaginary part of an inputted complex number signal. Five filter coefficients b0-b4 of the FIR filter 102 are real numbers. The FIR filter 102 outputs a result of filtering processing as imaginary part signal s'(n).

The FIR filter 103 is a FIR filter of a complex number coefficient having the number of taps of 5, the FIR filter performing filtering processing by complex number operation to complex number signal $x'(n)=r'(n)+js'(n)$ that includes real part signal r'(n) and imaginary part signal s'(n) to which filtering processing has been performed by the FIR filters 101 and 102. Five filter coefficients c0-c4 of the FIR filter 103 are complex numbers. The FIR filter 103 outputs a result of filtering processing as complex number signal x"(n).

In the block diagram of FIG. 9, a complex number signal is expressed by a line thicker than a line which indicates a signal of a real number in order to distinguish them. Hereinafter, lines which indicate a signal are expressed in a similar manner also in other block diagrams.

In filtering processing by a FIR filter, there is a case where both of filtering processing by real number operation using a filter coefficient of a real number and filtering processing by complex number operation using a filter coefficient of a complex number are performed as is the case with the digital filter circuit 100.

Generally, a minimum value of the number of taps of a FIR filter is determined by an impulse response length of a filter function desired to be realized. Therefore, when realizing a complicated filter function, the number of taps of more than several hundred taps may be needed. There is a problem that, in a LSI (Large Scale Integrated circuit) on which such a FIR filter with a large number of taps is mounted, the circuit scale and power consumption of the LSI becomes huge.

To cope with this problem, there is known a technology which performs filtering processing in a frequency domain (patent document 1, for example). In filtering processing in the frequency domain, signal data on the time domain is converted into a signal data on the frequency domain firstly by fast Fourier transform (FFT: Fast Fourier Transform). Then, after filtering calculation between the signal data and a filter coefficient has been carried out in the frequency domain, it is reconverted by high-speed inverse Fourier transform (IFFT: Inverse Fast Fourier Transform) into a signal data on the time domain.

In a case where the number of taps of a FIR filter is large, a circuit scale and electric power consumption required for realization of filtering processing can be reduced by performing filtering processing in the frequency domain. The reason is that convolution operation in the time domain by a FIR filter can be converted into simple multiplication in the frequency domain.

Meanwhile, when a signal in the time domain is a complex number signal, the complex number signal is converted by a complex FFT into complex number signal data of the frequency domain. In complex FFT conversion, the real part and the imaginary part of a complex number signal in the time domain are combined, and are converted into complex number signal data in the frequency domain. That is, both of the real part and the imaginary part of a complex number signal in the time domain are used for calculation of each of the real part and the imaginary part of complex number signal data in the frequency domain. For this reason, according to the technology of patent document 1, when filtering processing is performed independently to each of the real part and the imaginary part of a complex number signal of the time domain, it is necessary to convert them into signal data of the frequency domain by real number FFT independently from each other.

In FIG. 10, there is shown an exemplary configuration of a digital filter circuit 110 which performs filtering processing in the frequency domain. The digital filter circuit 110 corresponds to the digital filter circuit 100 shown in FIG. 9 that performs filtering processing in the time domain. The digital filter circuit 110 is a digital filter circuit which performs filtering processing in the frequency domain to complex number signal $x(n)$ $(=r(n)+js(n))$. The digital filter circuit 110 includes three frequency domain filter circuits 111, 112 and 113.

The frequency domain filter 111 converts real part signal r(n) which is the real part of inputted complex number signal x(n) on the time domain to complex number signal data on the frequency domain by FFT. Then, after performing filtering calculation by complex number operation on the frequency domain to complex number signal data on the frequency domain, the frequency domain filter 111 reconverts it into real part signal data r'(n) on the time domain by IFFT. Although real part signal r(n) is a signal of a real number, signal data after conversion will be a complex number even when Fourier transformation is applied to a signal of a real number. In addition, a filter coefficient is also a complex number usually. Therefore, complex number operation is required to filtering calculation.

Similarly, the frequency domain filter 112 converts imaginary part signal s(n) of a real number that is the imaginary part of inputted complex number signal x(n) on the time domain into complex number signal data on the frequency domain by FFT. Then, after performing filtering calculation by complex number operation on the frequency domain to complex number signal data on the frequency domain, the frequency domain filter 112 reconverts it into imaginary part signal data s'(n) of a real number on the time domain by IFFT.

On the other hand, the frequency domain filter 113 converts complex number signal x'(n)=r'(n)+js'(n) which includes real part signal r'(n) and imaginary part signal s'(n) into complex number signal data on the frequency domain by FFT. Then, after performing filtering calculation by complex number operation on the frequency domain to complex number signal data on the frequency domain, the frequency domain filter 113 reconverts it into imaginary part signal data s"(n) of the real number on the time domain by an IFFT.

A digital filter which handles an input signal as a complex number signal is also disclosed in patent document 2.

Further, a technology which performs inverse Fourier transformation after performing predetermined calculation using a complex number signal generated by performing Fourier transformation to an input signal and its complex conjugate value is also disclosed in patent document 3.

CITATION LIST

Patent Literature

[PTL 1] Japanese Patent Application Laid-Open No. 2011-4264
[PTL 2] International Publication WO No. 2007/010727
[PTL 3] Japanese Patent Application Laid-Open Hei No. 2-36385

SUMMARY OF INVENTION

Technical Problem

As it is clear from the structure of the digital filter circuit 110 shown in FIG. 10, in the technology of patent literature 1, independent filtering processing by real number operation is performed to each of the real part and the imaginary part of a complex number signal to perform filtering processing by complex number operation to the complex number signal. Therefore, when the technology of patent document 1 is applied, FFT and IFFT are needed for filtering processing for each of the real part and the imaginary part of a complex number signal by frequency domain filters. Accordingly, there is a problem that, in a LSI on which the above-mentioned filtering function is mounted, a circuit scale and electric power consumption becomes huge.

Also in the technologies of patent literature 2 and 3, independent filtering processing is needed for each of the real part and the imaginary part of a complex number signal to perform filtering processing by complex number operation to the complex number signal. Accordingly, there is the same problem as patent literature 1 that FFT and IFFT are needed for filtering processing for each of the real part and the imaginary part of a complex number signal by frequency domain filters.

Object of Invention

The present invention is made for settling the above-mentioned problem, and an object of the present invention is to provide a digital filter circuit, a digital filter processing method and a digital filter processing program storage medium which can achieve reduction of circuit scale and power consumption for performing digital filtering processing in the frequency domain.

Solution to Problem

A digital filter circuit of the present invention comprises: a complex conjugate generation means for generating a second complex number signal including respective conjugate complex numbers of all complex numbers included in a first complex number signal of a frequency domain generated by converting a complex number signal of a time domain by Fourier transform; a filter coefficient generation means for generating a first and a second frequency domain filter coefficient of a complex number from a first, a second and a third input filter coefficient of a complex number having been inputted; a first filtering means for performing filtering processing to the first complex number signal by the first frequency domain filter coefficient, and outputting a third complex number signal; a second filtering means for performing filtering processing to the second complex number signal by the second frequency domain filter coefficient, and outputting a fourth complex number signal; and a complex conjugate combining means for combining the third complex number signal and the fourth complex number signal, and generating a fifth complex number signal.

A digital filter processing method of the present invention comprises the steps of: generating a second complex number signal including respective conjugate complex numbers of all complex numbers included in a first complex number signal of a frequency domain generated by converting a complex number signal of a time domain by Fourier transform; generating a first and a second frequency domain filter coefficient of a complex number from a first, a second and a third input filter coefficient of a complex number having been inputted; performing filtering processing to the first complex number signal by the first frequency domain filter coefficient, and outputting a third complex number signal; performing filtering processing to the second complex number signal by the second frequency domain filter coefficient, and outputting a fourth complex number signal; and combining the third complex number signal and the fourth complex number signal, and generating a fifth complex number signal.

A digital filter processing program storage medium of the present invention stores a program for making a computer provided in an arithmetic device function as: a complex conjugate generation means for generating a second complex number signal including respective conjugate complex numbers of all complex numbers included in a first complex number signal of a frequency domain generated by converting a complex number signal of a time domain by Fourier transform; a filter coefficient generation means for generating a first and a second frequency domain filter coefficient of a complex number from a first, a second and a third input filter coefficient of a complex number having been inputted; a first filtering processing means for performing filtering processing to the first complex number signal by the first frequency domain filter coefficient, and outputting a third complex number signal; a second filtering processing means for performing filtering processing to the second complex number signal by the second frequency domain filter coefficient, and outputting a fourth complex number signal; and a complex conjugate combining means for combining the third complex number signal and the fourth complex number signal, and generating a fifth complex number signal.

Advantageous Effects of Invention

According to the present invention, reduction of circuit scale and power consumption for performing digital filtering processing in a frequency domain can be achieved.

DESCRIPTION OF EMBODIMENTS

Next, an exemplary embodiment of the present invention will be described with reference to a drawing.

The First Exemplary Embodiment

Figure 1:
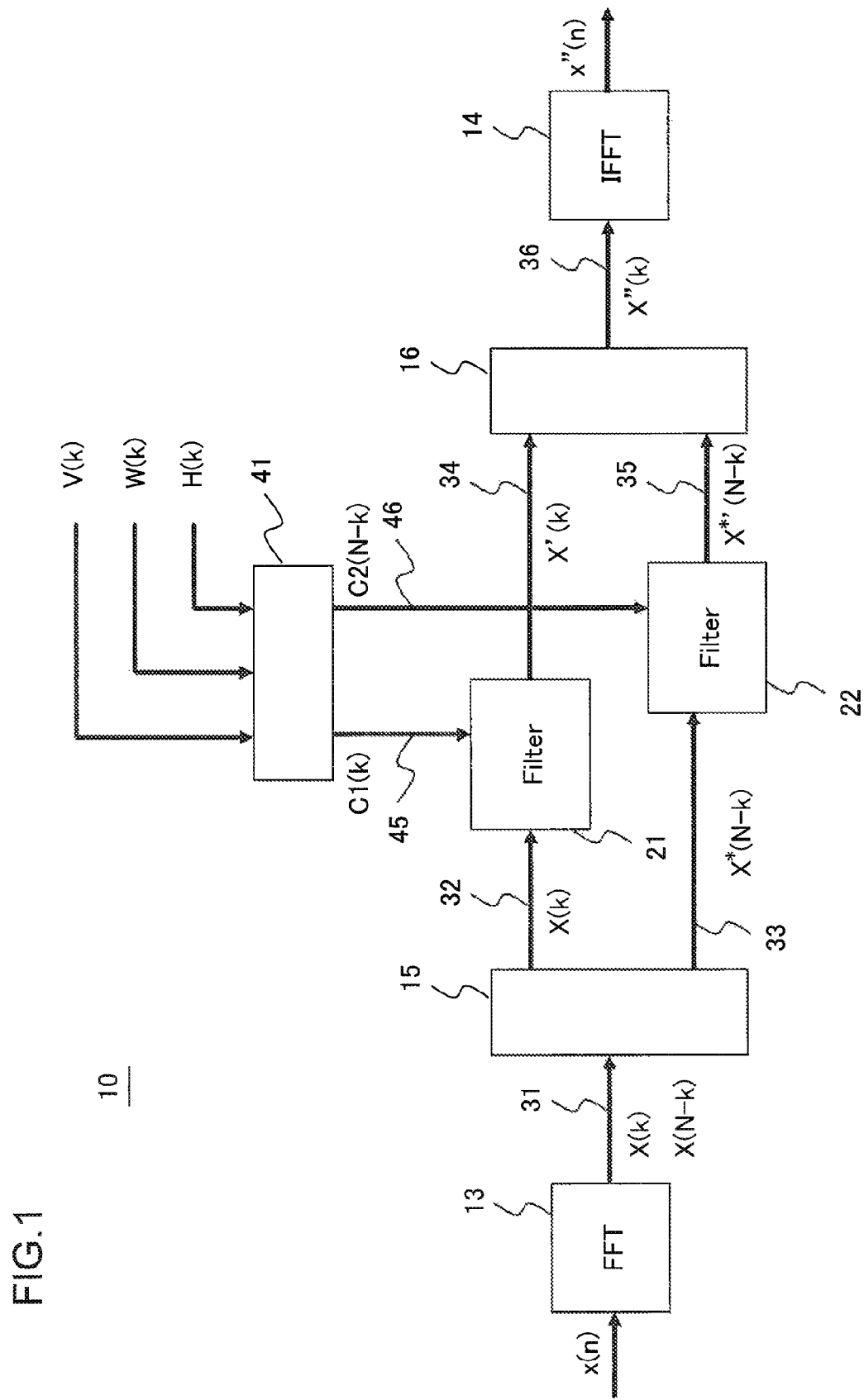
FIG. 1 A block diagram showing a structure of a digital filter circuit according to a first exemplary embodiment of the present invention FIG. 2 A block diagram showing a structure of a complex conjugate generating circuit 15 according to the first exemplary embodiment of the present invention FIG. 3 A block diagram showing a structure of a filter circuit 21 according to the first exemplary embodiment of the present invention FIG. 4 A block diagram showing a structure of a filter circuit 22 according to the first exemplary embodiment of the present invention.

FIG. 1 is a block diagram showing a structure of a digital filter circuit 10 according to the first exemplary embodiment of the present invention. The digital filter circuit 10 includes a FFT circuit 13, an IFFT circuit 14, the complex conjugate generating circuit 15, the complex conjugate combining circuit 16, the filter circuit 21, the filter circuit 22 and the filter coefficient generating circuit 41.

The following complex number signal in a time domain is inputted to the digital filter circuit 10.

$$x(n)=r(n)+js(n) \quad (1)$$

The FFT circuit 13 converts inputted complex number signal x(n) into the following complex number signal of a frequency domain by FFT.

$$X(k)=A(k)+jB(k) \quad (2)$$

Here, n is an integer of $0 \leq n \leq N-1$ which indicates a signal sample number on the time domain, N is an integer of $0<N$ which shows the number of conversion samples of FFT, and k is an integer of $0 \leq k \leq N-1$ which shows a frequency number on the frequency domain.

The FFT circuit 13 generates $$X(N-k)=A(N-k)+jB(N-k) \quad (3)$$

from X(k), and outputs X(N-k).

Meanwhile, FFT is one method for performing Fourier transform at high speed. A processing form and a processing speed of Fourier transform are not essential problems for the present invention. Accordingly, a circuit which performs Fourier transform by a method besides FFT is allowed to be used instead of the FFT circuit 13. This point is also similar about IFFT mentioned later.

The complex conjugate generating circuit 15 receives input X(N-k) which the FFT circuit 13 outputs about each of frequency number k of $0 \leq k \leq N-1$, and generates the following complex conjugate of X(N-k).

$$X^*(N-k)=A(N-k)-jB(N-k) \quad (4)$$

The complex conjugate generating circuit 15 outputs inputted complex number signal X(k) as a complex number signal 32, and outputs complex number signal X*(N-k) which has been generated as a complex number signal 33.

Next, about each of frequency number k of $0 \leq k \leq N-1$, the filter coefficient generating circuit 41 generates from inputted complex number coefficients V(k), W(k) and H(k) the following two complex number coefficients.

$$C1(k)=\{V(k)+W(k)\} \times H(k) \quad (5)$$

$$C2(k)=\{V(k)-V(k)\} \times H(k) \quad (6)$$

Here, complex number coefficient V(k), W(k) and H(k) are coefficients in the frequency domain which are given from a higher rank circuit (not shown) of the digital filter circuit 10, and correspond to real number filter coefficients when performing filtering processing by real number operation in the time domain. Description of details of V(k), W(k) and H(k) will be made later.

The filter coefficient generating circuit 41 outputs generated complex number coefficient C1(k) as a complex number signal 45. The filter coefficient generating circuit 41 generates complex number signal C2(N-k) from complex number signal C2(k) (Formula (6)), and outputs C2(N-k) as a complex number signal 46.

Next, the filter circuit 21 performs complex number filtering processing by complex number multiplication to X(k) (Formula (2)) which the complex conjugate generating circuit 15 outputs to the complex number signal 32, using C1(k) (Formula (5)) which the filter coefficient generating circuit 41 outputs to the complex number signal 45. Specifically, about each frequency number k of $0 \leq k \leq N-1$, the filter circuit 21 calculates a complex number signal $$X'(k)=X(k) \times C1(k) \quad (7)$$

and outputs it as a complex number signal 34.

Similarly, the filter circuit 22 performs complex number filtering processing by complex number multiplication to X*(N-k) (Formula (4)) which the complex conjugate generating circuit 15 outputs to the complex number signal 33, using C2(N-k) (Formula (6)) which the filter coefficient generating circuit 41 outputs to the complex number signal 46. Specifically, about each frequency number k of 0≤k≤N−1, the filter circuit 22 calculates a complex number signal $$X^{*\prime}(N-k)=X^*(N-k)\times C2(N-k) \qquad (8)$$

and outputs $X^{*\prime}(N-k)$ as a complex number signal 35.

Each of C1(k) and C2(k) can be written by being divided into a real part and an imaginary part as follows.

$$C1(k)=C1I(k)+jC1Q(k) \qquad (9)$$

$$C2(k)=C2I(k)+jC2Q(k) \qquad (10)$$

Next, the complex conjugate combining circuit 16 generates complex number signal X″(k) by combining X′(k) (Formula (7)) which the filter circuit 21 outputs to the complex number signal 34 with $X^{*\prime}(N-k)$ (Formula (8)) which the filter circuit 22 outputs to the complex number signal 35. Specifically, about each of frequency number k of 0≤k≤N−1, the complex conjugate combining circuit 16 calculates $$X''(k)=\tfrac{1}{2}\times\{X'(k)+X^{*\prime}(N-k)\} \qquad (11)$$

and outputs it as a complex number signal 36.

Next, about each of frequency number k of 0≤k≤N−1, the IFFT circuit 14 generates complex number signal x″(n) of the time domain for X″(k) (Formula (11)) which the complex conjugate combining circuit 16 outputs to the complex number signal 36 by IFFT, and outputs x″(n).

Figure 2:
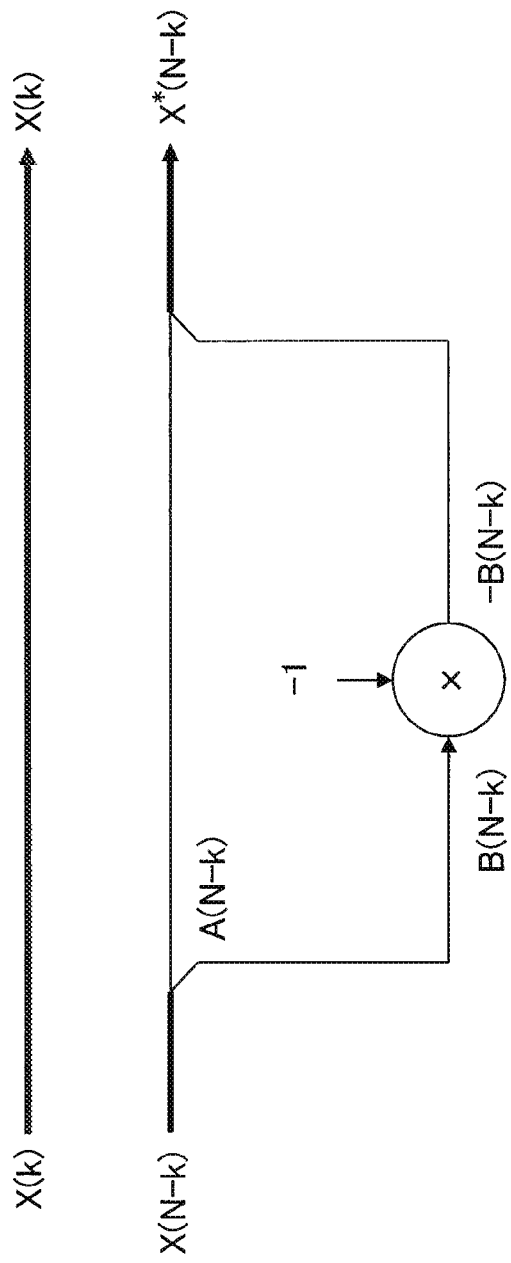

FIG. 2 is a block diagram showing detail of a structure of the complex conjugate generating circuit 15. The complex conjugate generating circuit 15: receives output of the FFT circuit 13 X(k) (=A(k)+jB(k): Formula (2)), and outputs X(k) just as it is; and also receives output X(N−k) (=A(N−k)+jB(N−k): Formula (3)), and calculates $$X^*(N-k)=A(N-k)-jB(N-k) \qquad (4)$$

and outputs $X^*(N-k)$.

Each of X(k) and $X^*(N-k)$ can be written by being divided into a real part and an imaginary part as follows.

$$X(k)=XI(k)+jXQ(k) \qquad (12)$$

$$X^*(N-k)=X^*I(N-k)+jX^*Q(N-k) \qquad (13)$$

Figure 3:
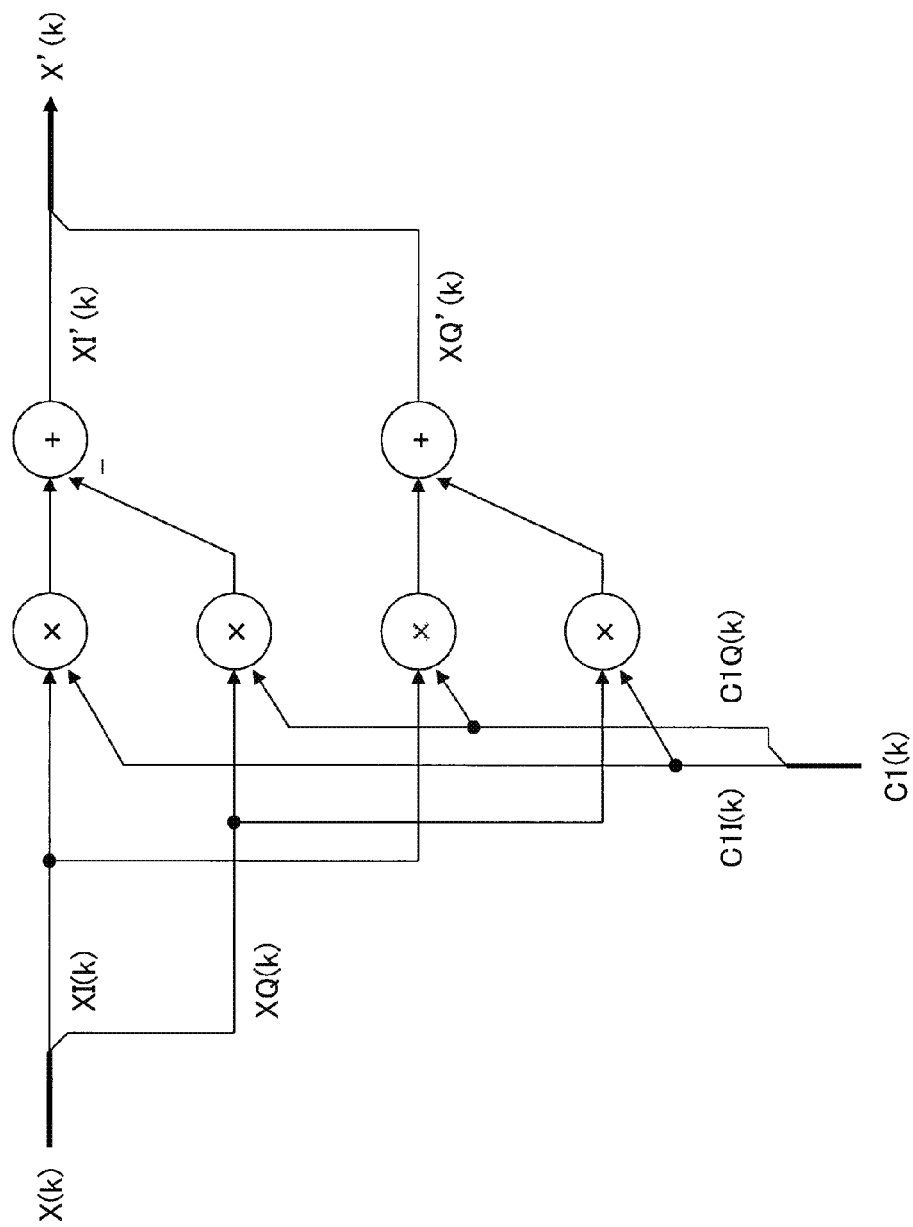

FIG. 3 is a block diagram showing detail of a structure of the filter circuit 21. The filter circuit 21 receives X(k) (=XI(k)+jXQ(k): Formula (12)) which the complex conjugate generating circuit 15 outputs to the complex signal line 32 and complex number coefficient C1(k) (=C1I(k)+jC1Q(k): Formula (9)), and calculates $$X'(k) = XI'(k) + jXQ'(k) \qquad (14)$$
$$= X(k)\times C1(k)$$

and outputs X′(k).

Here, XI′(k) and XQ′(k) are the real part and the imaginary part of X′(k), respectively, and are given by the following equation.

$$XI'(k)=XI(k)\times C1I(k)-XQ(k)\times C1Q(k) \qquad (15)$$

$$XQ'(k)=XI(k)\times C1Q(k)+XQ(k)\times C1I(k) \qquad (16)$$

Figure 4:
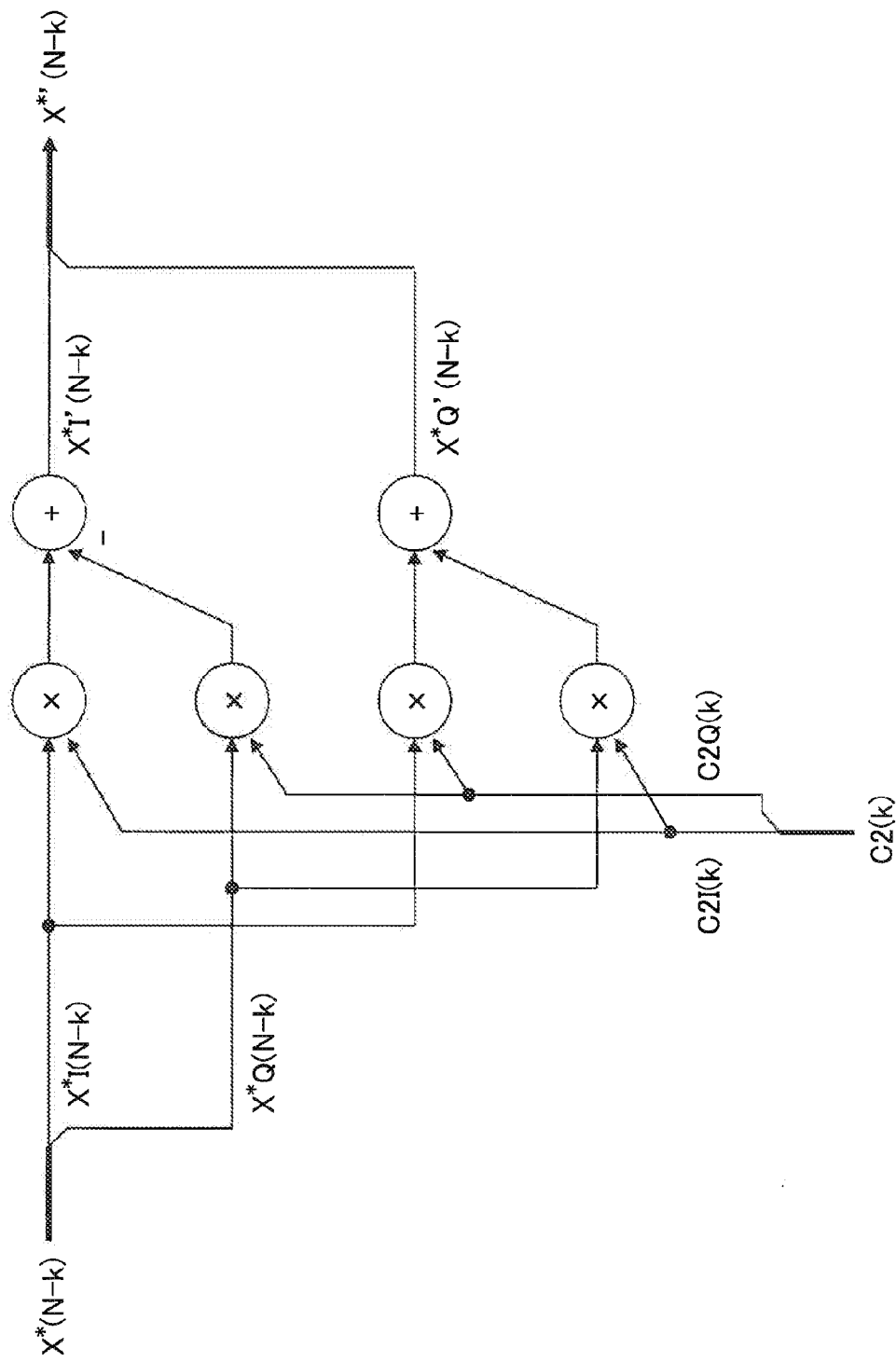

FIG. 4 is a block diagram showing detail of a structure of the filter circuit 22. The filter circuit 22 receives $X^*(N-k)$ (=X*I(N−k)+jX*Q(N−k): Formula (13)) which the complex conjugate generating circuit 15 outputs to a complex signal line 33 and complex number coefficient C2(k) (=C2I(k)+jC2Q(k): Formula (10)), calculates $$X^{*\prime}(N - k) = X^*I'(N - k) + jX^*Q'(N - k) \qquad (17)$$
$$= X^*(N - k)\times C2(N - k)$$

and outputs $X^{*\prime}(N-k)$.

Here, X*I′(N−k) and X*Q′(N−k) are the real part and the imaginary part of $X^{*\prime}(N-k)$, and are given by the following equations, respectively.

$$X^*I'(N-k)=X^*I(N-k)\times C2I(N-k)-X^*Q(N-k)\times C2Q(N-k) \qquad (18)$$

$$X^*Q'(N-k)=X^*I(N-k)\times C2Q(N-k)+X^*Q(N-k)\times C2I(N-k) \qquad (19)$$

Figure 5:
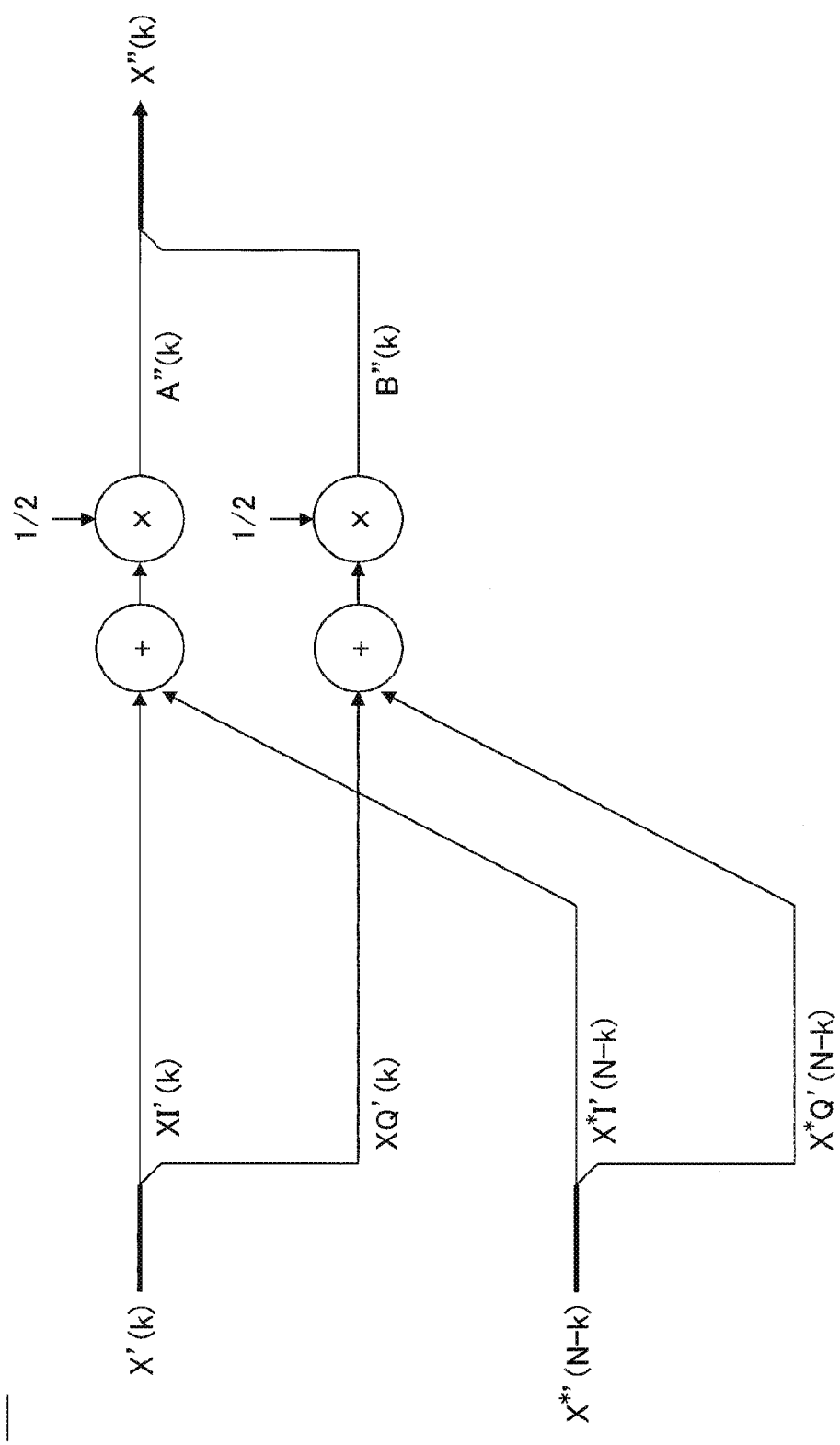
FIG. 5 A block diagram showing a structure of a complex conjugate combining circuit 16 according to the first exemplary embodiment of the present invention FIG. 6 A block diagram showing a structure of a filter coefficient generating circuit 41 according to the first exemplary embodiment of the present invention FIG. 7 A block diagram of a digital filter circuit having only an indispensable structure of a digital filter circuit according to the first exemplary embodiment of the present invention FIG. 8A A flow chart showing a first example of a processing procedure of a digital filter processing program according to a second exemplary embodiment of the present invention FIG. 8B A flow chart showing a second example of a processing procedure of a digital filter processing program according to the second exemplary embodiment of the present invention FIG. 9 A block diagram showing an exemplary configuration of a digital filter circuit using a FIR filter FIG. 10 A block diagram showing an exemplary configuration of a digital filter circuit which performs a filtering processing in the frequency domain

FIG. 5 is a block diagram showing detail of a structure of the complex conjugate combining circuit 16. About each of frequency number k of 0≤k≤N−1, the complex conjugate combining circuit 16 receives: X′(k) (=XI′(k)+jXQ′(k): Formula (14)) which the filter circuit 21 outputs to the complex number signal 32; and $X^{*\prime}(N-k)$ (=X*I′(N−k)+jX*Q′(N−k): Formula (17)) which the filter circuit 22 outputs to the complex number signal 33, calculates $$X''(k) = XI''(k) + jXQ''(k) \qquad (20)$$
$$= 1/2\{X'(k) + X^{*\prime}(N - k)\}$$

and outputs X″(k).

Here, XI″(k) and XQ″(k) are the real part and the imaginary part of X″(k), respectively, and are given by the following equations.

$$XI''(k)=\tfrac{1}{2}\{XI'(k)+X^*I'(N-k)\} \qquad (21)$$

$$XQ''(k)=\tfrac{1}{2}\{XQ'(k)+X^*Q'(N-k)\} \qquad (22)$$

Here, XI′(k), XQ′(k), X*I′(N−k) and X*Q′(N−k) are respectively given by the Formulas (15), (16), (18) and (19).

Figure 6:
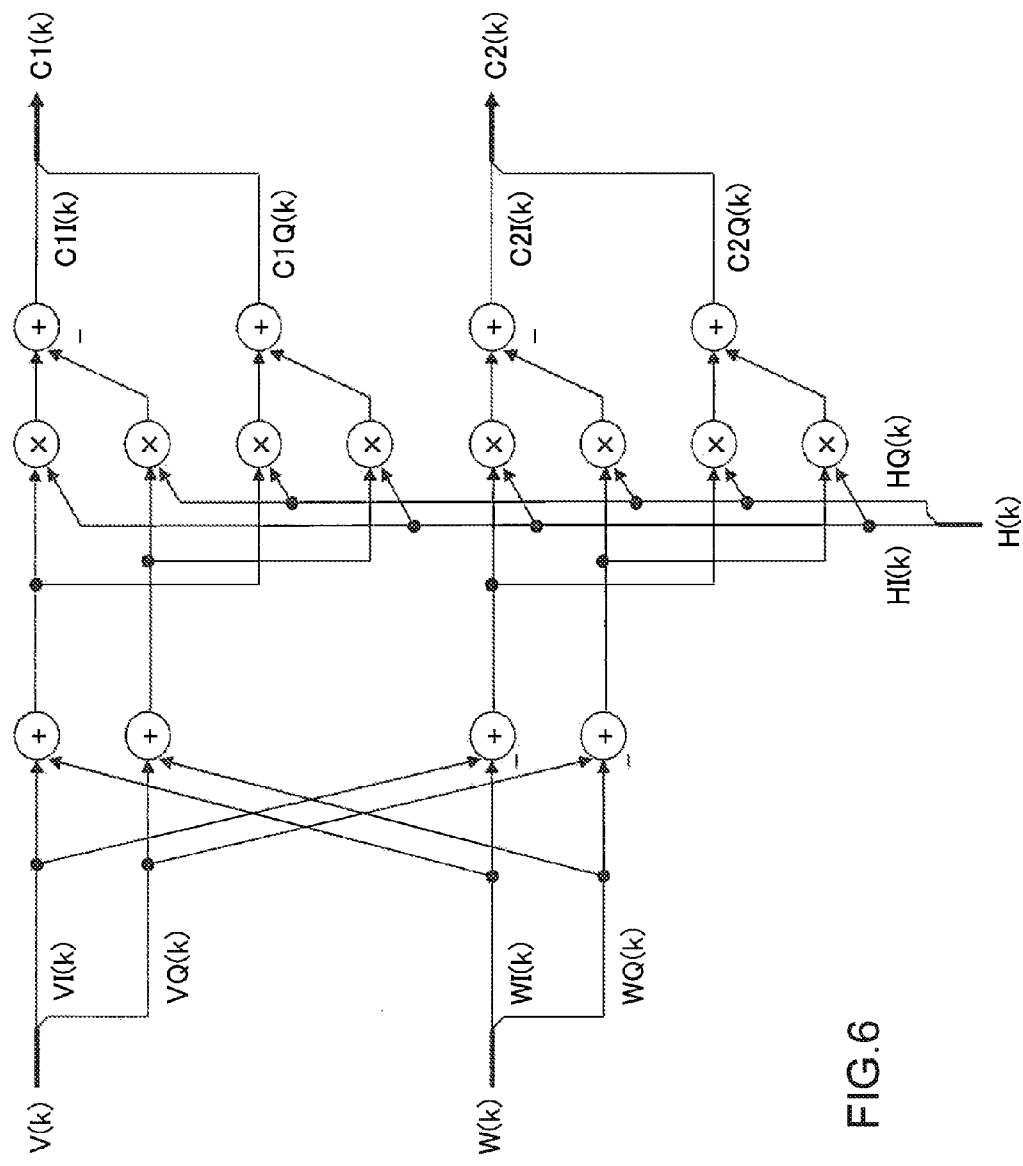

The filter coefficient generating circuit 41 generates the complex number coefficients C1(k) and C2(k) used in the filter circuits 21 and 22. FIG. 6 is a block diagram showing detail of a structure of the filter coefficient generating circuit 41. About each of frequency number k of 0≤k≤N−1, the filter coefficient generating circuit 41 calculates V(k)+W(k) and V(k)−W(k) from complex number coefficients V(k) and W(k) inputted from a higher rank circuit (not shown).

Here, they are as follows.

$$V(k)+W(k)=VI(k)+WI(k)+jVQ(k)+jWQ(k) \qquad (23)$$

$$V(k)-W(k)=VI(k)-WI(k)+jVQ(k)-jWQ(k) \qquad (24)$$

Here, VI(k) and VQ(k) are the real part and the imaginary part of V(k), respectively, and WI(k) and WQ(k) are the real part and the imaginary part of W(k), respectively.

Also, H(k) can be written as follows in a manner being divided into the real part and the imaginary part.

$$H(k)=HI(k)+jHQ(k) \qquad (25)$$

Next, the filter coefficient generating circuit 41 calculates the complex number coefficients C1(k) and C2(k) defined by the following Formulas and outputs C1(k) and C2(k).

$$C1(k) = C1I(k) + jC1Q(k) \quad (26)$$
$$= \{V(k) + W(k)\} \times H(k)$$

$$C2(k) = C2I(k) + jC2Q(k) \quad (27)$$
$$= \{V(k) - W(k)\} \times H(k)$$

Where, C1I(k) and C1Q(k) are the real part and the imaginary part of C1(k), respectively, and C2I(k) and C2Q(k) are the real part and the imaginary part of C2(k), respectively.

When substituting Formula (23) and (25) into Formula (26), we get the following formula.

$$C1(k) = \{VI(k) + WI(k) + jVQ(k) + jWQ(k)\} \times \{HI(k) + jHQ(k)\} \quad (28)$$

Accordingly, we obtain the following.

$$C1I(k) = \{VI(k) + WI(k)\} \times HI(k) - \{VQ(k) + WQ(k)\} \times HQ(k) \quad (29)$$

$$C1Q(k) = \{VQ(k) + WQ(k)\} \times HI(k) + \{VI(k) + WI(k)\} \times HQ(k) \quad (30)$$

Similarly, when Formula (24) and (25) are substituted into Formula (27), we get the following formula.

$$C2(k) = C2I(k) + jC2Q(k) \quad (31)$$
$$= \{V(k) - W(k)\} \times H(k)$$
$$= \{VI(k) - WI(k) + jVQ(k) - jWQ(k)\} \times \{HI(k) + jHQ(k)\}$$

Accordingly, we get the following.

$$C2I(k) = \{VI(k) - WI(k)\} \times HI(k) - \{VQ(k) - WQ(k)\} \times HQ(k) \quad (32)$$

$$C2Q(k) = \{VQ(k) - WQ(k)\} \times HI(k) + \{VI(k) - WI(k)\} \times HQ(k) \quad (33)$$

As above, the digital filter circuit 10 performs FFT conversion of an input signal of the time domain, and generates a complex number signal of the frequency domain. Then, the digital filter circuit 10 performs filtering processing to each of the real part and the imaginary part of the complex number signal of the frequency domain independently using two kinds of coefficients generated from V(k), W(k) and H(k), and converts the result of the processing into a signal of the time domain by IFFT. Thus, in the digital filter circuit 10, each of FFT and IFFT is carried out only once to an input signal of the time domain.

Two kinds of coefficients used for filtering processing enable to minimize the number of times of FFT and IFFT. The physical meaning of V(k), W(k) and H(k) and a principle by which filtering processing in the frequency domain that is equal to desired filtering processing in the time domain becomes possible by filtering processing using coefficients C1(k) and C2(k) generated from V(k), W(k) and H(k) will be described below.

In this exemplary embodiment, from a complex number signal of the frequency domain $$X(k) = R(k) + jS(k) \quad (34)$$

which has been generated by performing complex FFT to inputted complex number signal x(n) (=r(n)+js(n): Formula (1)) of the time domain, the complex conjugate generating circuit 15 generates X*(N−k).

Here, R(k) is a complex number signal of the frequency domain made by converting real part signal r(n) of a real number in the time domain using real number FFT, and S(k) is a complex number signal of the frequency domain made by converting imaginary part signal s(n) of a real number in the time domain using real number FFT. At that time, the following equation holds from symmetry of complex conjugate.

$$X^*(N-k) = R(k) - jS(k) \quad (35)$$

Here, X*(N−k) is the complex conjugate of X(N−k).
From Formulas (14), (34) and (26), we obtain the following.

$$X'(k) = X(k) \times C1(k) \quad (36)$$
$$= \{R(k) + jS(k)\} \times \{V(k) + W(k)\} \times H(k)$$
$$= R(k)V(k)H(k) + R(k)W(k)H(k) + jS(k)V(k)H(k) + jS(k)W(k)H(k)$$

Also, from Formulas (17), (35) and (27), we get the following.

$$X^{*'}(N-k) = X^*(N-k) \times C2(N-k) \quad (37)$$
$$= \{R(k) - jS(k)\} \times \{V(k) - W(k)\} \times H(k)$$
$$= R(k)V(k)H(k) - R(k)W(k)H(k) - jS(k)V(k)H(k) + jS(k)W(k)H(k)$$

When Formulas (36) and (37) are substituted into Formula (20), we get $$X''(k) = 1/2 \times \{X'(k) + X^{*'}(N-k)\} \quad (38)$$
$$= 1/2 \times \{2 \times R(k)V(k)H(k) + 2 \times jS(k)W(k)H(k)\}$$
$$= R(k)V(k)H(k) + jS(k)W(k)H(k)$$
$$= \{R(k)V(k) + jS(k)W(k)\} \times H(k)$$

Formula (38) represents signal X″(k) that is a signal before IFFT using filter coefficients V(k), W(k) and H(k), and R(k) and S(k) in signal X(k) after FFT. R(k) is a complex number signal of the frequency domain made by converting real part signal r(n) of a real number in the time domain by real number FFT. S(k) is a complex number signal of the frequency domain made by converting imaginary part signal s(n) of a real number in the time domain by real number FFT. In other words, Formula (38) represents the contents of filtering processing performed to signal X(k) after FFT. From Formula (38), it is found that the digital filter circuit 10 performs processing equal to the following three pieces of filtering processing to complex number signal X(k) (=R(k)+jS(k): Formula (34)) of the frequency domain which has been generated by converting complex number signal x(n)=r(n)+js(n) by real number FFT.

1) Filtering Processing for R(k) by Coefficient V(k)
First, the digital filter circuit 10 performs filtering processing by filter coefficient V(k) to a complex number signal R(k) of the frequency domain which has been made by converting real part signal r(n) in the time domain by real number FFT. Accordingly, assigned to V(k) is a complex number filter coefficient of the frequency domain corresponding to a real number filter coefficient when performing filtering processing by real number operation in the time domain to real part signal r(n).

2) Filtering Processing by Coefficient W(k) to S(k)

Similarly, the digital filter circuit 10 performs filtering processing by filter coefficient W(k) to a complex number signal S(k) of the frequency domain which has been made by converting imaginary part signal s(n) in the time domain by real number FFT. Accordingly, assigned to W (k) is a complex number filter coefficient of the frequency domain corresponding to a real number filter coefficient when performing filtering processing by real number operation in the time domain to imaginary part signal s(n).

3) Filtering Processing by Coefficient H(k) to Results of Filtering Processing 1) and 2)

Next, the digital filter circuit 10 performs filtering processing by filter coefficient H(k) to complex number signal R(k)V(k)+jS(k)W(k) which includes R(k)V(k) and S(k)W (k) after the above-mentioned two filtering processing processed independently, respectively.

Figure 9:
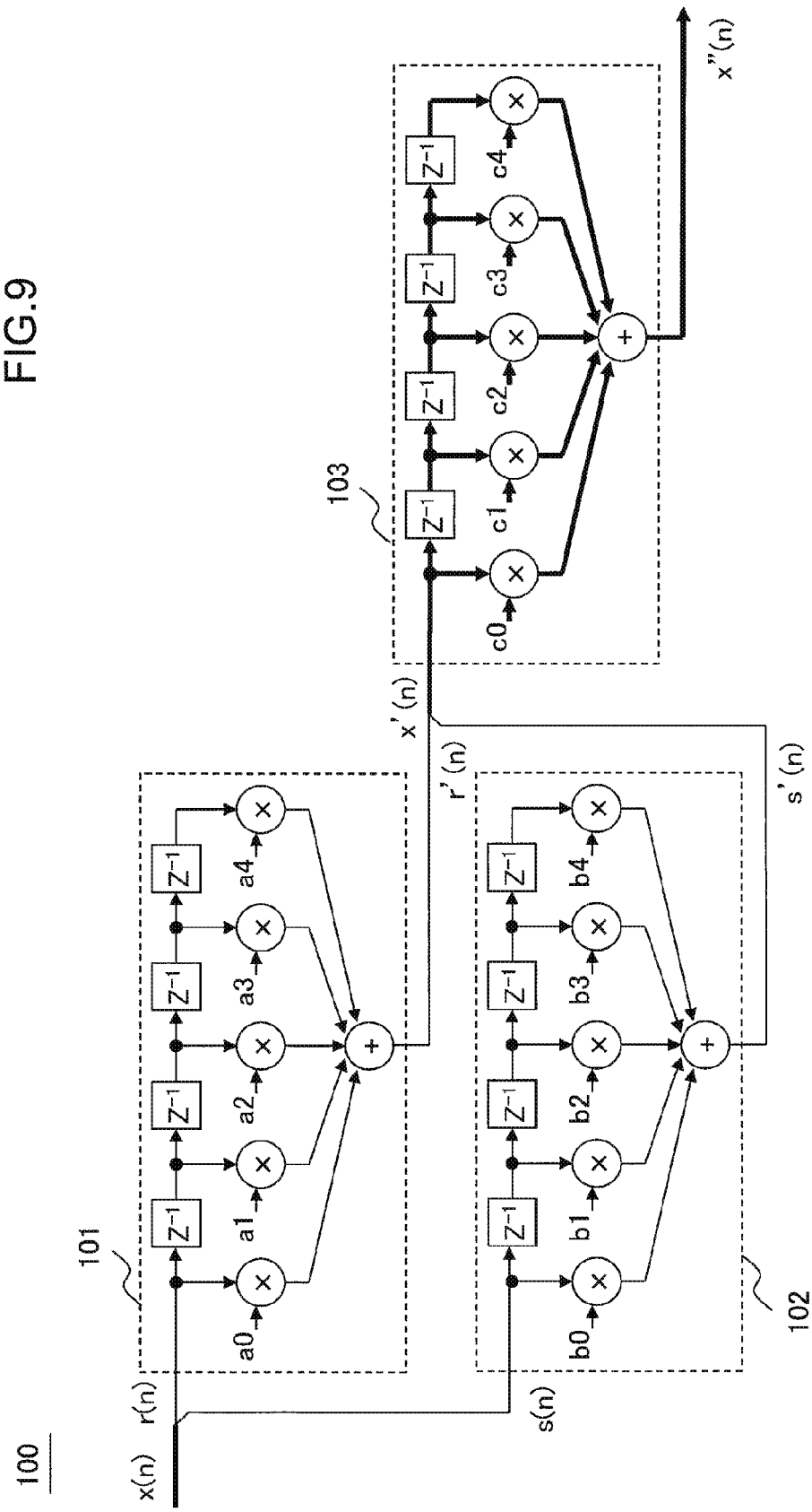
Figure 10:
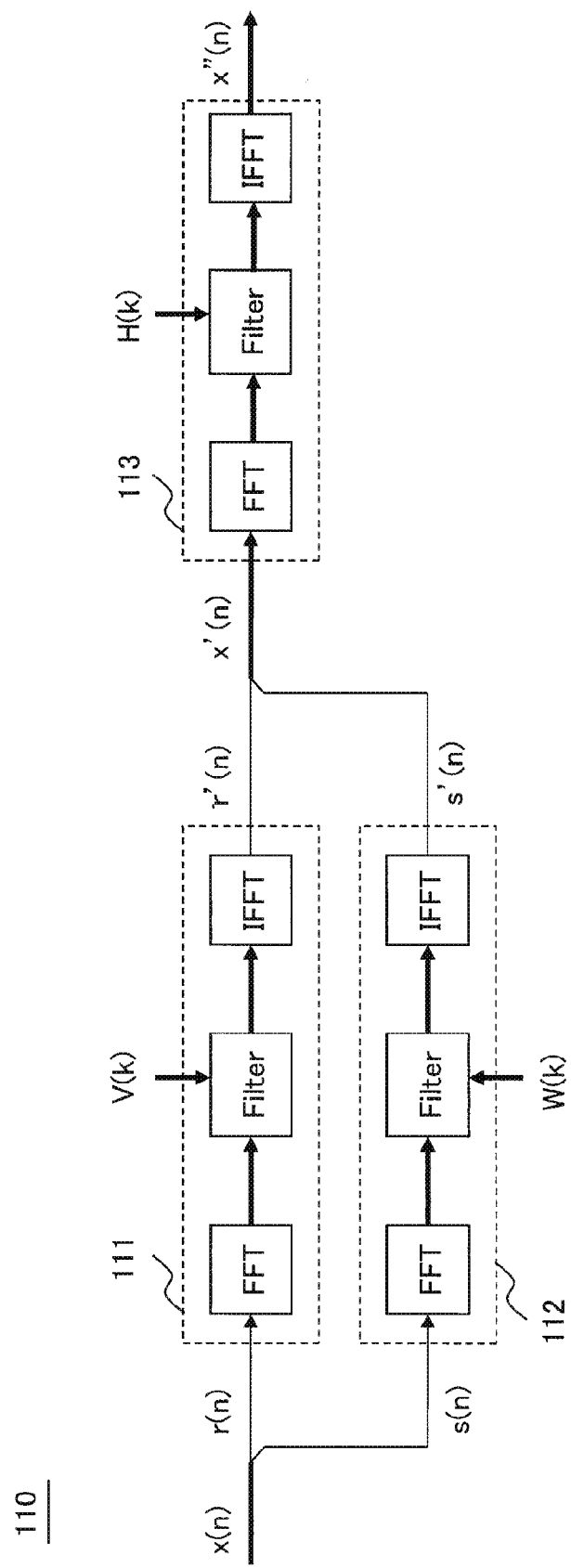

R(k)V(k)+jS(k)W(k) is a complex number signal of the frequency domain corresponding to a signal of the time domain including two signals which are signals made by performing filtering processing to each of real part signal r(n) and imaginary part signal s(n) in the time domain independently. A signal made by performing filtering processing to each of real part signal r(n) and imaginary part signal s(n) independently corresponds to r'(n), s'(n) in FIGS. 9 and 10. Also, a signal of the time domain including r'(n) and s'(n) corresponds to x'(n) of FIGS. 9 and 10. Thus, R(k)V(k)+jS(k)W(k) is a signal of the frequency domain corresponding to a signal of the time domain made by performing filtering processing to each of the real part and the imaginary part independently in the time domain.

Accordingly, in order to perform to signal R(k)V(k)+jS(k)W(k) of the frequency domain processing corresponding to filtering processing performed to a complex number signal in the time domain by complex number operation, the following coefficient should be used. That is, a complex number filter coefficient in the frequency domain that corresponds to a complex number filter coefficient when performing filtering processing by complex number operation in the time domain to complex number signal x(n) should be assigned to H(k).

As described above, three kinds of coefficient are set from outside in this exemplary embodiment. That is, there are set: filter coefficient V(k) and W(k) of the frequency domain corresponding to filter coefficients in the time domain for each of the real part and the imaginary part of complex number signal x(n); and coefficient H(k) of the frequency domain corresponding to a filter coefficient in the time domain for x(n). By performing filtering processing using two coefficients obtained from the above three coefficients, FFT before the filtering processing and IFFT after the filtering processing can be made to be only once, respectively.

Figure 7:
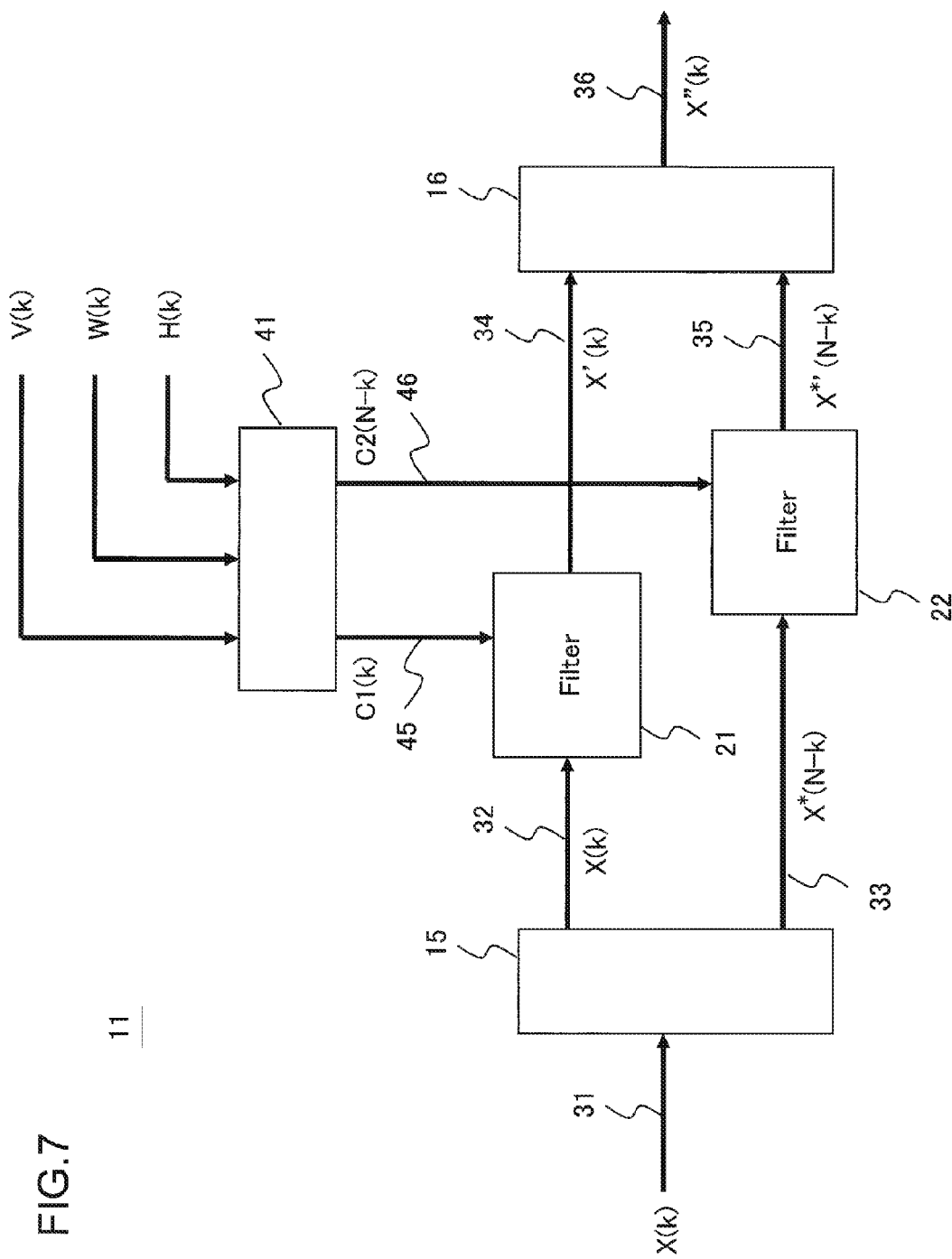

By the way, FFT and IFFT in the digital filter circuit 10 are usual conversions respectively, and no processing unique to the present invention is performed. Therefore, FFT and IFFT may be processed by a circuit outside the digital filter circuit 10. That is, a digital filter circuit may input a signal from an external Fourier conversion circuit, and perform only filtering processing, and output a processing result to an external inverse Fourier transform circuit. Accordingly, a block diagram of the digital filter circuit 110 having only an indispensable structure of a filter circuit of this exemplary embodiment will be as shown in FIG. 7. A block diagram of FIG. 7 is a diagram made by removing the FFT circuit 13 and the IFFT circuit 14 from the structure of FIG. 1. The digital filter circuit 110 includes the complex conjugate generating circuit 15, the complex conjugate combining circuit 16, the filter circuit 21, the filter circuit 22 and the filter coefficient generating circuit 41. Because the function of each of these blocks is the same as that of the digital filter circuit 10, description will be omitted.

When processing of FFT and IFFT is performed outside, circuits needed for performing FFT and IFFT are only one respectively, and a plurality of circuits, for such as a real part and an imaginary part, do not need to be used.

Effect of the First Exemplary Embodiment

As described above, according to this exemplary embodiment, filtering processing using two kinds of filter coefficient of frequency domain corresponding to filter coefficients of the time domain for each of the real part and the imaginary part of a complex number signal and a coefficient of the frequency domain corresponding to a filter coefficient of the time domain for a complex signal is performed. That is, filtering processing in the frequency domain corresponding to: independent filtering processing by real number operation for each of the real part and the imaginary part of a complex number signal in the time domain; and filtering processing by complex number operation for a complex number signal in the time domain is performed. Accordingly, desired filtering processing can be realized using only one FFT circuit which performs FFT before the filtering processing and one IFFT circuit which performs IFFT after the filtering processing. As a result, this exemplary embodiment has an effect that reduction in a circuit size and power consumption for performing filtering processing can be achieved.

Second Exemplary Embodiment

In the first exemplary embodiment, it is assumed that all of each piece of processing of FFT, IFFT, generation and combining of a conjugate complex number, calculation of a filter coefficient and filtering processing are processed by components such as individual circuits. Each piece of processing of the present invention may be carried out, not by the form like the first exemplary embodiment, but by software that uses a computer provided in predetermined equipment such as a DSP (Digital Signal Processor).

In the second exemplary embodiment, an example when performing filtering processing by a computer program is described. A computer program is read by a DSP (not shown) and executed. Meanwhile, in this exemplary embodiment, a structure of an exemplary embodiment is not shown in particular because hardware besides a computer which performs program processing is not used.

Figure 8A:
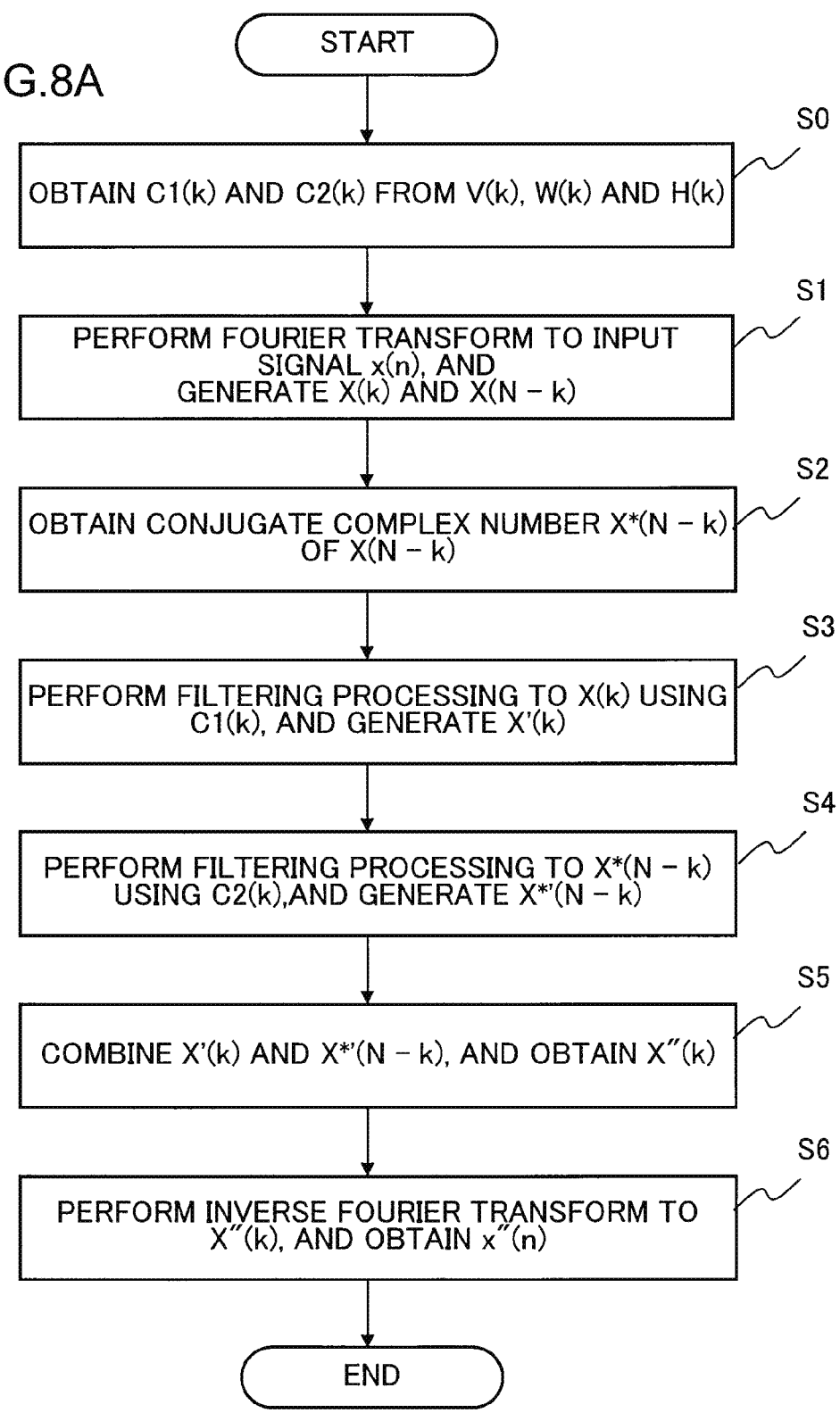

FIGS. 8A and 8B are flow charts showing an example of a processing procedure of a filtering processing program of the second exemplary embodiment of the present invention. A signal name such as X(k) and an information name such as V(k) used in the following description are the same as those used in the first exemplary embodiment.

In the processing of FIG. 8A, at first, a DSP obtains C1(k) and C2(k) from V(k), W(k) and H(k) (Step S0). Meanwhile, the processing of Step 0 should simply be carried out before filtering processing (Steps S3 and S4) mentioned later, and does not need to be carried out first necessarily.

Next, the DSP performs Fourier transform to input signal X(n) (Step S1), and generates X(k) and X(N−k).

Furthermore, the DSP obtains conjugate complex number X*(N−k) of X(N−k) (Step S2).

Then, the DSP performs filtering processing to X(k) using C1(k), and generates X'(k) (Step S3). The DSP performs filtering processing to X*(N−k) using C2(k), and generates X*'(N−k) (Step S4). Order of processing of Step S3 and Step S4 may be reversed to the above description.

Next, the DSP combines X'(k) and X*'(N−k), and obtains X"(k) (Step S5).

Finally, the DSP performs inverse Fourier transform to X"(k), and obtains x"(n) (Step S6).

As above, the contents of filtering processing of the second exemplary embodiment are the same as those of the first exemplary embodiment. Accordingly, there is the same effect as the first exemplary embodiment in the filtering processing of the second exemplary embodiment.

Meanwhile, calculation of filter coefficients C1(k) and C2(k) may be performed by a different program in advance. In that case, a flow chart showing operations will be like FIG. 8B because processing of Step 0 becomes unnecessary. In addition, individual processing such as FFT and IFFT may be processed by other processors.

The above-mentioned filtering processing program may be stored in a non-temporary medium such as: a semiconductor memory device, such as ROM (Read Only Memory), RAM (Random Access Memory) and a flash memory; an optical disk; a magnetic disk; and a magneto-laser disk.

The first exemplary embodiment and the second exemplary embodiment may be combined. That is, part of processing may be processed by hardware, and the other processing may be processed by software. For example, FFT and IFFT may be processed using the FFT circuit 13 and the IFFT circuit 14, respectively, and the other processing be carried out by software. An assignment of processing by hardware and processing by software can be determined freely.

Although the present invention has been described with reference to an exemplary embodiment above, the present invention is not limited to the above-mentioned exemplary embodiments. Various modifications which a person skilled in the art can understand can be made in the composition and details of the present invention within the scope of the present invention.

This application claims priority based on Japanese application Japanese Patent Application No. 2012-034002, filed on Feb. 20, 2012, the disclosure of which is incorporated herein in its entirety.

REFERENCE SIGNS LIST

10 Digital filter circuit
13 FFT circuit
14 IFFT circuit
15 Complex conjugate generating circuit
16 Complex conjugate combining circuit
21 Filter circuit
22 Filter circuit
31-36 Complex number signal
41 Filter coefficient generating circuit
45 and 46 Complex number signal
100 Digital filter circuit
101-103 FIR filter
111-113 Frequency domain filter circuit

What is claimed is:

1. A digital filter circuit, comprising:
a complex conjugate generation unit that generates a second complex number signal including respective conjugate complex numbers of all complex numbers included in a first complex number signal of a frequency domain generated by converting a complex number signal of a time domain by Fourier transform;
a filter coefficient generation unit that generates a first and a second frequency domain filter coefficient of a complex number from a first, a second and a third input filter coefficient of a complex number having been inputted;
a first filtering unit that performs filtering processing to the first complex number signal by the first frequency domain filter coefficient, and outputting a third complex number signal;
a second filtering unit that performs filtering processing to the second complex number signal by the second frequency domain filter coefficient, and outputting a fourth complex number signal; and
a complex conjugate combining unit that combines the third complex number signal and the fourth complex number signal, and generating a fifth complex number signal.

2. The digital filter circuit according to claim 1, further comprising:
a Fourier transform unit that converts the complex number input signal of the time domain having been inputted into the first complex number signal by the Fourier transform; and
an inverse Fourier transform unit that converts the fifth complex number signal into a signal of the time domain by inverse Fourier transform.

3. The digital filter circuit according to claim 1, wherein,
when assuming that the number of conversion samples of the Fourier transform is N (N is an integer of N>0),
the complex conjugate generation unit generates a conjugate complex number of a complex number signal of frequency number (N−k) included in the first complex number signal as the second complex number signal.

4. The digital filter circuit according to claim 3, wherein
the complex conjugate combining unit generates the fifth complex number signal by performing, for each of frequency number k in a range of 0≤k≤N−1, complex addition of first complex data of frequency number k included in the third complex number signal and a second complex data of frequency number (N−k) included in the fourth complex number signal.

5. The digital filter circuit according to claim 1, wherein the filter coefficient generation unit:
generates the first frequency domain filter coefficient by, after performing complex addition of the second input filter coefficient to the first input filter coefficient, further performing complex multiplication by the third input filter coefficient; and
generates the second frequency domain filter coefficient by, after performing complex subtraction of the second input filter coefficient from the first input filter coefficient, further performing complex multiplication by the third input filter coefficient.

6. The digital filter circuit according to claim 1, wherein
the first frequency domain filter coefficient is a complex number filter coefficient of the frequency domain corresponding to a filter coefficient for a real part of the complex input signal in a time domain filtering processing, the time domain filtering processing being filtering processing of the time domain for the complex input signal, wherein the second frequency domain filter coefficient is a complex number filter coefficient of the frequency domain corresponding to a filter coefficient for an imaginary part of the complex input signal in the time domain filtering processing, and wherein the third frequency domain filter coefficient is a complex number filter coefficient of the frequency domain corresponding to a filter coefficient for the complex number input signal in the time domain filtering processing.

7. A digital filter processing method implemented by one or more processors the digital filter processing method, comprising:

receiving a first complex number signal from a Fourier transform unit, wherein the first complex number signal is generated by converting a complex number signal of the time domain into the first complex number by Fourier transform;

generating a second complex number signal including respective conjugate complex numbers of all complex numbers included in the first complex number signal of a frequency domain;

generating a first and a second frequency domain filter coefficient of a complex number from a first, a second and a third input filter coefficient of a complex number having been inputted;

performing filtering processing to the first complex number signal by the first frequency domain filter coefficient, and outputting a third complex number signal;

performing filtering processing to the second complex number signal by the second frequency domain filter coefficient, and outputting a fourth complex number signal;

combining the third complex number signal and the fourth complex number signal, and generating a fifth complex number signal; and outputting the fifth complex number signal to an inverse Fourier transform unit.

8. A non-transitory storage medium storing a digital filter processing program for making a computer provided in an arithmetic device function as:

a complex conjugate generation unit that generates a second complex number signal including respective conjugate complex numbers of all complex numbers included in a first complex number signal of a frequency domain generated by converting a complex number signal of a time domain by Fourier transform;

a filter coefficient generation unit that generates a first and a second frequency domain filter coefficient of a complex number from a first, a second and a third input filter coefficient of a complex number having been inputted;

a first filtering processing unit that performs filtering processing to the first complex number signal by the first frequency domain filter coefficient, and outputting a third complex number signal;

a second filtering processing unit that performs filtering processing to the second complex number signal by the second frequency domain filter coefficient, and outputting a fourth complex number signal; and a complex conjugate combining unit that combines the third complex number signal and the fourth complex number signal, and generating a fifth complex number signal.

* * * * *